United States Patent
Kishida

(10) Patent No.: US 10,134,742 B2
(45) Date of Patent: Nov. 20, 2018

(54) SEMICONDUCTOR DEVICE INCLUDING A SEMICONDUCTOR SUBSTRATE, A PILLAR, AND A BEAM

(71) Applicant: Micron Technology, Inc., Boise, ID (US)

(72) Inventor: Takeshi Kishida, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 14/663,878

(22) Filed: Mar. 20, 2015

(65) Prior Publication Data

US 2015/0279845 A1    Oct. 1, 2015

(30) Foreign Application Priority Data

Mar. 31, 2014   (JP) ................. 2014-072115

(51) Int. Cl.
   *H01L 27/108*   (2006.01)
(52) U.S. Cl.
   CPC .. *H01L 27/10897* (2013.01); *H01L 27/10814* (2013.01); *H01L 27/10835* (2013.01); *H01L 27/10852* (2013.01)
(58) Field of Classification Search
   CPC ......... H01L 27/10814; H01L 27/10835; H01L 27/10852; H01L 27/10897; H01L 27/10876
   USPC .................................................. 257/296, 306
   See application file for complete search history.

(56) References Cited

U.S. PATENT DOCUMENTS

| 6,667,502 B1* | 12/2003 | Agarwal | H01L 27/10817 257/296 |
| 6,822,280 B2 | 11/2004 | Eiji et al. | |
| 8,395,235 B2* | 3/2013 | Tsuchiya | H01L 27/10814 257/306 |
| 2002/0028541 A1* | 3/2002 | Lee | G11C 16/3427 438/149 |
| 2003/0085420 A1* | 5/2003 | Ito | H01L 27/10852 257/309 |
| 2005/0287780 A1* | 12/2005 | Manning | H01L 27/10817 438/593 |
| 2008/0179652 A1* | 7/2008 | Sugioka | H01L 27/10852 257/306 |
| 2010/0155802 A1* | 6/2010 | Ohuchi | H01L 27/10814 257/306 |
| 2010/0193853 A1* | 8/2010 | Busch | H01L 27/10852 257/306 |
| 2011/0073925 A1* | 3/2011 | Park | H01L 21/28518 257/306 |
| 2012/0211815 A1* | 8/2012 | Mikasa | H01L 27/10876 257/306 |
| 2013/0248974 A1* | 9/2013 | Alsmeier | G11C 16/04 257/321 |

FOREIGN PATENT DOCUMENTS

| JP | 2003-142605 | 5/2003 |
| JP | 2011-061067 | 3/2011 |

* cited by examiner

*Primary Examiner* — Nitin Parekh
(74) *Attorney, Agent, or Firm* — Wells St. John P.S.

(57) ABSTRACT

The semiconductor storage device includes a lower electrode that are vertically extended from a semiconductor substrate, a beam including a first portion extending in a horizontal direction to support the lower electrode and a second portion that is vertically extended along the exterior wall of the electrode from the first portion.

12 Claims, 14 Drawing Sheets

US 10,134,742 B2

SEMICONDUCTOR DEVICE INCLUDING A SEMICONDUCTOR SUBSTRATE, A PILLAR, AND A BEAM

This application is based upon and claims the benefit of priority from Japanese Patent Application No. P2014-072115 filed on 31 Mar. 2014, the disclosure of which is incorporated herein in its entirety by reference.

FIELD OF THE INVENTION

The present invention relates to a semiconductor device and particularly relates to a semiconductor device having a structure in which pillar-shaped structures such as lower electrodes of capacitors are supported by support films (beams).

DESCRIPTION OF PRIOR ART

Japanese Patent Application Laid-Open No. 2003-142605 and Japanese Patent Application Laid-Open No. 2011-61067 disclose structures in which lower electrodes of capacitors are supported by support films. These documents further disclose structures in which a dielectric beam includes a plurality of layers. The above described semiconductor devices are formed by forming a plurality of dielectric beams one by one from the lower layer side, then forming through holes, and forming lower electrodes in the through holes. The outer sidewalls of the lower electrodes are configured to be in contact with the dielectric beams, and collapse and twisting of the lower electrodes are reduced. However, if the aspect ratio of the lower electrodes is increased, the strength of the support films becomes insufficient, and there is a risk that the lower electrodes are detached from the support films.

DETAILED DESCRIPTION OF THE EMBODIMENT

A preferred embodiment of the present invention will be hereinafter described in detail while referencing the accompanying drawings.

(Semiconductor Device)

A configuration of the semiconductor device according to the present embodiment will be explained by using FIG. 1 to FIG. 4. The semiconductor device of the present embodiment constitutes a DRAM (Dynamic Random Access Memory).

Figure 1:
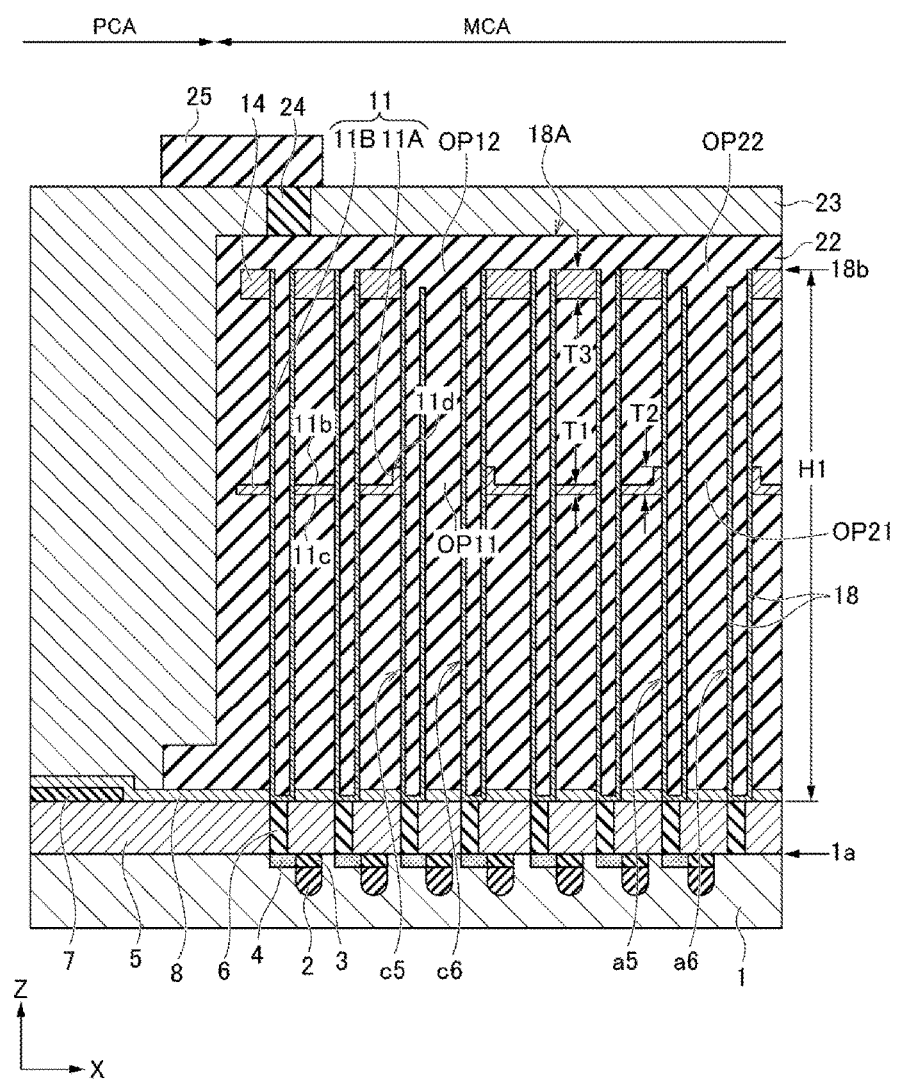
FIG. 1 is a cross sectional view of a semiconductor device according to an embodiment of the present invention.

FIG. 1 shows an A-A' cross-section of the plan view shown in FIG. 2, which will be described later. The DRAM according to the present embodiment has a memory cell region MCA in which a plurality of capacitors are formed and a peripheral circuit region PCA. A plurality of buried gate electrodes 2 and a cap dielectric 3 covering tops of the buried gate electrodes 2 are disposed in a semiconductor substrate 1 positioned in the memory cell region MCA. An impurity diffusion layer (hereinafter, diffusion layer) 4 serving is formed as a source or a drain of a transistor on the semiconductor substrate 1 adjacent to the cap dielectric 3. A first interlayer dielectric 5 is disposed on a surface 1a of the semiconductor substrate 1. A plurality of contact plugs 6 is disposed to penetrate through the first interlayer dielectric 5, and to be connected to the diffusion layer 4. Unshown bit lines are buried in the first interlayer dielectric 5. A peripheral circuit 7 is disposed on the first interlayer dielectric 5 of the peripheral circuit region PCA. A stopper silicon nitride film 8 is disposed so as to cover the first interlayer dielectric 5, the contact plugs 6, and the peripheral circuit 7. Eight lower electrodes 18 penetrate through the stopper silicon nitride film 8 and are connected to the tops of the contact plugs 6, and are arranged in an X direction (first direction). The lower electrodes 18 constitute pillars. In the present embodiment, the lower electrodes 18 have crown structures, but the present invention is not limited thereto. The lower electrodes 18 may be the electrodes having simple cylindrical shapes. Each of the lower electrodes 18 extends to a Z direction (third direction) perpendicular to the surface 1a of the semiconductor substrate 1. For the sake of convenience of explanation, symbols c5, c6, a5, and a6 are added to some of the lower electrodes 18. In the later described explanations, the symbols c5, c6, a5, and a6 may be described as the symbols of the respectively corresponding capacitors.

Upper ends of the lower electrodes 18 are mutually coupled by a second beam 14. The second beam 14 includes second openings OP12 and OP 22, which are separated from each other. A first beam 11 is disposed at the positions of the lower electrodes 18 that are intermediate in the Z direction (third direction) serving as the direction perpendicular to the surface 1a of the semiconductor substrate 1 and mutually couple the lower electrodes 18. The first beam 11 includes first openings OP11 and OP 21, which are separated from each other. In FIG. 1, the first opening OP11 and the second opening OP12 provided at the same position in the X direction are configured to be positionally aligned in the Z direction by the same pattern. The same applies to the other openings. The first beam 11 includes a first portion 11B, which is parallel to the surface 1a of the semiconductor substrate 1, and second portions 11A, which projects in the Z direction from the first portion 11B at an end of the first opening OP11. The first portion 11B has a first film thickness T1 sandwiched by a top 11b and a bottom 11c in the Z direction, and the second portion 11A has a second film thickness T2 sandwiched by a top 11d and the bottom 11c in the Z direction. The second beam 14 has a third film thickness T3 in the Z direction as well as the first beam 11.

The film thickness T1 of the first portion 11B may be set in a range of 1/10 to 1/5 of the film thickness T3 of the second beam 14. The film thickness T2 of the second portion 11A may be set in a range of 3 to 5 times the film thickness T1 of the first portion 11B. The first portion 11B may be preferred to be disposed at a position that is higher than the half of a height H1 of the lower electrode 18 and is lower than 1/4 of H1 from an upper end 18b.

In the memory cell region MCA, an unshown capacitor dielectric is provided so as to cover part of the top of the stopper silicon nitride film 8, the surfaces of the lower electrodes 18, the surface of the first beam 11, and the surface of the second beam 14. An upper electrode 22 is disposed so as to cover the surface of the capacitor dielectric and bury the spaces between the lower electrodes 18 and the internal spaces of the lower electrodes 18. As a result, an island-shaped capacitor mold 18A is formed in the memory cell region MCA. A second interlayer dielectric 23 is disposed so as to cover the capacitor mold 18A and bury the peripheral circuit region PCA. A via plug 24, which penetrates through the second interlayer dielectric 23 and is connected to the upper electrode 22, is disposed. Furthermore, supply wiring 25 is connected to a top of the via plug 24, and is disposed on the second interlayer dielectric 23. An unshown interlayer dielectric and wiring are repeatedly disposed above the supply wiring 25 to constitute the DRAM.

Figure 2:
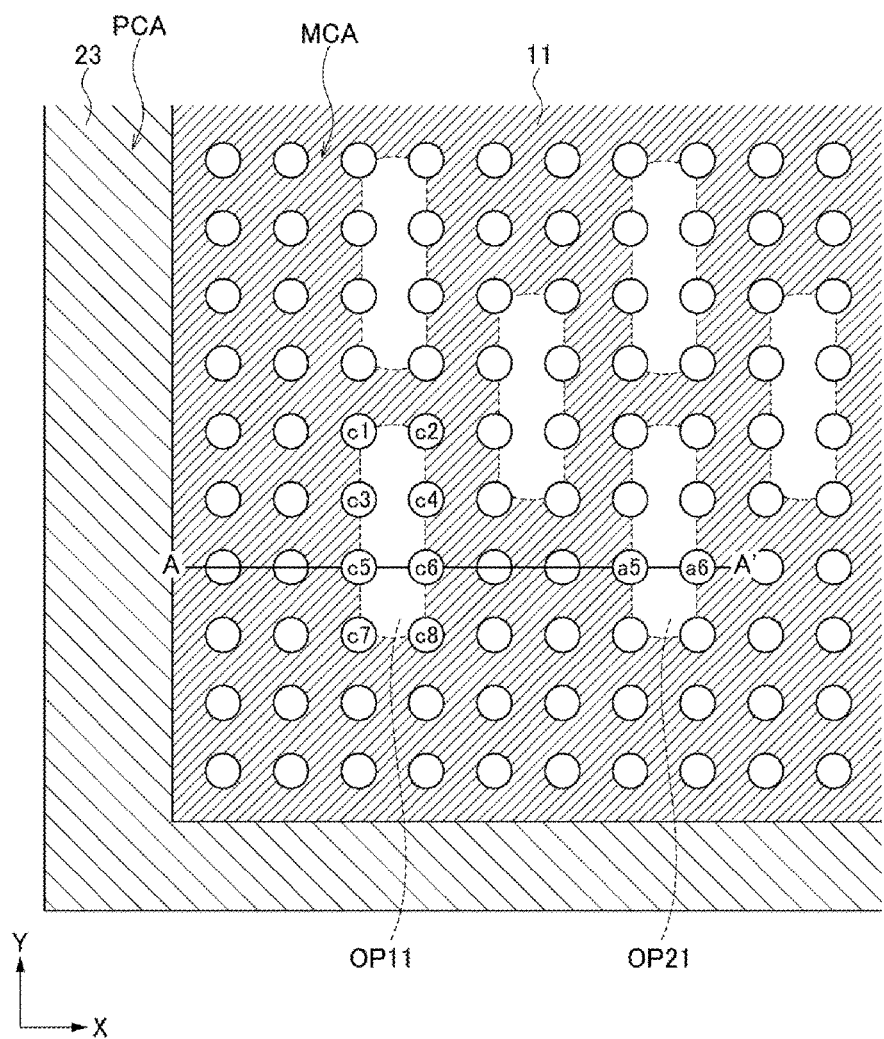
FIG. 2 is a plan view of the semiconductor device according to the embodiment of the present invention.

FIG. 2 is a XY plan view of a case in which the cross-sectional view shown in FIG. 1 is sectioned at the position of the first beam 11 by a plane parallel to the surface 1a of the semiconductor substrate 1. Note that illustration of the upper electrode 22 is omitted. Therefore, the first beam 11 appears in the memory cell region MCA, and the second interlayer dielectric 23 appears in the peripheral circuit region PCA.

At the first beam 11, the plurality of first openings (for example, OP11, OP21) are disposed in a state in which the openings are separated from each other. Although not illustrated in FIG. 2, the second beam 14 is configured to have the second openings OP12 and OP 22, which have same patterns as the first openings, at the positions positionally-aligned in the Z direction and overlapped with the first openings. Each of the first openings is approximately formed by a rectangle, and eight capacitors (lower electrodes) are disposed so as to intersect with the ends of the opening. For example, if the first opening OP11 is focused, four capacitors c1, c2, c7, and c8 are disposed to be overlapped with corner portions of the opening. In total four capacitors, i.e., c3 and c5 are disposed to be overlapped with a long side of one side of the opening, c4 and c6 are disposed to be overlapped with a long side of the other side.

Figure 3:
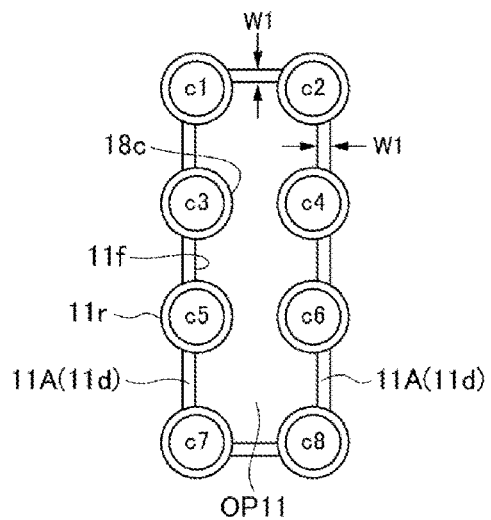
FIG. 3 is a drawing enlarging a first opening OP11 shown in FIG. 2.

FIG. 3 illustrates an enlarged view of the first opening OP11. The second portions 11A of the first beam 11 are disposed along opening edges 11f of the first opening OP11. In other words, the second portion 11A is positioned between the two adjacent lower electrodes 18. The second portion 11A has the top 11d. In a planar view, a part 18c of the sidewall of each of the lower electrodes is configured to be exposed in the first opening OP11.

Figure 4:
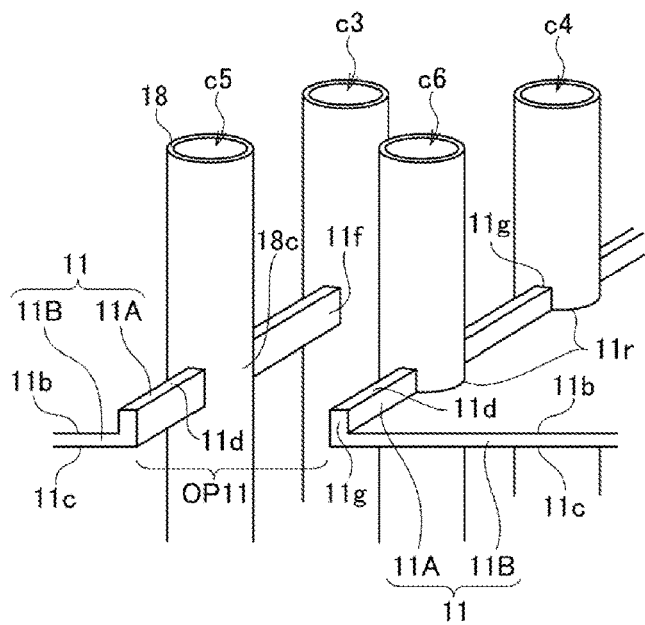
FIG. 4 is a perspective view for explaining the state of contact between lower electrodes 18 and a first beam 11.

FIG. 4 is a perspective view for explaining the state of contact between the lower electrodes 18 and the first beam 11. As an example, the four lower electrodes c3, c4, c5, and c6 are extracted for illustration. The lower electrodes 18 are disposed so as to bite into the first beam 11. Therefore, the sidewall of the lower electrode 18 is configured to be in contact with an arc 11r, which includes the first portion 11B of the first beam 11, and a cross section 11g, which includes the second portion 11A. By virtue of this, compared with the case in which only the arc 11r is in contact therewith, supporting strength can be increased by increasing the contact area corresponding to the cross-sectional area of the cross section 11g; therefore, twisting of the lower electrodes is effectively suppressed. On the other hand, at the arc 11r, the first portion 11B is configured to be in direct contact therewith, wherein the second portion 11A is not involved; therefore, this contributes to prevention of reduction in the capacitor capacity by reducing the reduction in the sidewall area of the lower electrode. The part 18c of the sidewall of each of the lower electrodes which is not in contact of both of the arc 11r and the cross section 11g of the second portion 11A is configured to be exposed in the first opening OP11. As shown in FIG. 3, in order to have the above described configuration, the width W1 of the second portion 11A in the X direction and the Y direction may be preferred to be in the range of 1/5 to 2/5 of the diameter of the lower electrode 18.

As described above, the semiconductor device according to the present embodiment includes at least the plurality of lower electrodes 18, which extend in the third direction perpendicular to the surface 1a of the semiconductor substrate 1, and the first beam 11, which is positioned at an intermediate position of the plurality of lower electrodes 18 in the third direction and has the plurality of first openings OP11. The first beam 11 has the first portion 11B, which is extended in parallel to the surface 1a of the semiconductor substrate 1 and has the first film thickness T1. The first beam 11 also has the second portions 11A, which are extended along the patterns of the first openings OP11, projecting in the third direction from the first portion 11B, and have the second film thickness T2 thicker than the first film thickness T1. The lower electrodes 18 are disposed to be overlapped with the opening edges 11*f* of the first openings OP11 in the planar view, and part of the sidewalls of the lower electrodes 18 is in contact with the first portion 11B and the second portions 11A.

The lower electrodes 18 which are not faced to the first openings and the second openings are in contact with the second beam 14 and the first beam 11 across the entire peripheries of the outer sidewalls thereof. In this case, the first beam 11 contacts the lower electrodes by the first portion 11B, and the second portions 11A are not in contact therewith.

(Manufacturing Method of Semiconductor Device)

A manufacturing method of the semiconductor device according to the embodiment of the present invention will be explained in detail with reference to FIG. 5 to FIG. 15. Herein, a DRAM is shown as an example of the semiconductor device. However, the present invention can be applied to a semiconductor device other than a DRAM that supports high-aspect-ratio pillar-shaped structures by a support film(s) (beam(s)).

(Forming Step of First Cylinder Dielectric (First Dielectric))

Figure 5A:
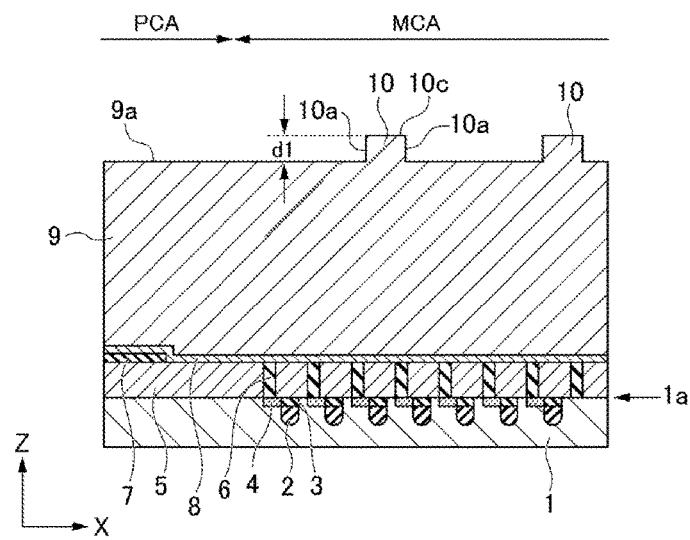
FIGS. 5A and 5B show sectional views for explaining a manufacturing method of the semiconductor device according to the embodiment of the present invention.
Figure 5B:
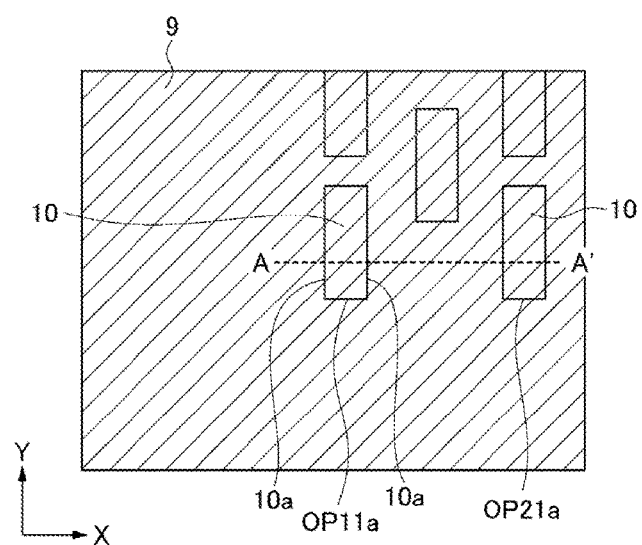

A cross-sectional view of FIG. 5A and a plan view of FIG. 5B will be referenced. FIG. 5B is a plan view corresponding to FIG. 2. FIG. 5A corresponds to an A-A' cross section shown in FIG. 5B. FIG. 5A shows an example of the configuration of the semiconductor substrate 1 on which capacitors are disposed.

The configuration of the semiconductor substrate 1 of FIG. 5A is manufactured approximately in a below manner. Gate trenches are formed in the memory cell region MCA of the semiconductor substrate 1. A conductor is formed on the entire surface so as to bury the gate trenches. The buried gate electrodes 2, which consist of the conductor, are formed in the gate trenches by etching back the conductor. Furthermore, the cap dielectric 3 is formed to cover the tops of the buried gate electrodes 2 and bury the gate trenches. The impurity diffusion layer 4 is formed on the surface 1*a* of the semiconductor substrate 1, which is adjacent to the buried gate electrodes 2. Then, the first interlayer dielectric 5 is formed on the semiconductor substrate 1. Furthermore, the contact plugs 6 is formed to penetrate through the first interlayer dielectric 5. The peripheral circuit 7, etc. are formed in the peripheral circuit region PCA. Then, the stopper silicon nitride film 8 is formed on the entire surface. Furthermore, the first cylinder dielectric (first dielectric) 9 is formed. The first cylinder dielectric uses impurity-containing silicon such as BPSG (Boro-Phospho Silicate Glass) film.

(Forming Step of Convex Pattern)

Then, as shown in FIG. 5A and FIG. 5B, convex patterns 10 are formed in the memory cell region MCA. First, a first mask film, which is not shown, is formed by using a lithography method on the first cylinder dielectric 9, which is positioned in the memory cell region MCA. The pattern of the first mask film is formed as reversal patterns OP11*a* and OP21*a* which are reversed patterns of the first openings OP11 and OP21. Then, the first cylinder dielectric 9 is etched by a depth d1 by an anisotropic dry etching method while using the first mask film as a mask. Then, the first mask film is removed. As a result, the convex patterns 10 are formed as each having a top 10*c* and a pair of sidewalls 10*a*, which are mutually opposed in the X direction. Moreover, a new top 9*a* is formed on the first cylinder dielectric 9.

(Forming Step of First Beam and First Openings)

Figure 6:
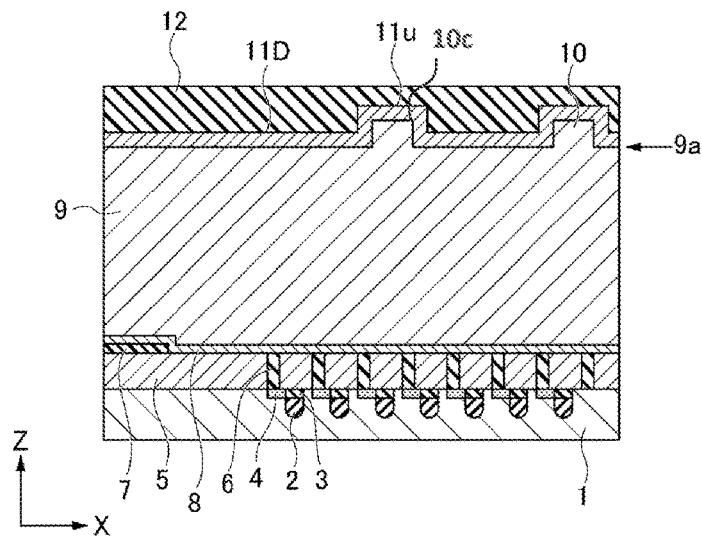
FIG. 6 is a sectional view for explaining the manufacturing method of the semiconductor device according to the embodiment of the present invention.

Then, as shown in FIG. 6, a silicon nitride film (first beam material) 11D is formed to serve as the first beam. The silicon nitride film 11D, which is formed on the tops 10*c* of the convex patterns 10, constitutes a top silicon nitride film 11*u*. Then, an organic coating film 12 is formed so as to bury the top silicon nitride film 11*u*. Since the organic coating film 12 is formed by using a coating method, the top thereof becomes flat.

Figure 7:
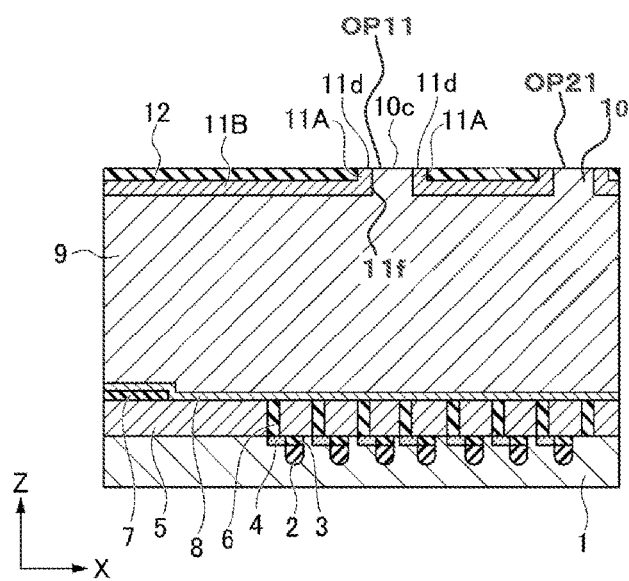
FIG. 7 is a sectional view for explaining the manufacturing method of the semiconductor device according to the embodiment of the present invention.

Then, as shown in FIG. 7, the entire surfaces of the organic coating film 12 and the top silicon nitride film 11*u* are etched back by a dry etching method until the top silicon nitride film 11*u* is removed. When the top silicon nitride film 11*u* is removed, the top 10*c* of the convex pattern 10 is exposed. As a result, the first beam 11 including the first portions 11B and the second portions 11A is formed. The second portion 11A is formed along the sidewall of the convex pattern 10. The first openings OP11 and OP21 are formed to be surrounded by the second portions 11A. The sidewalls of the first openings OP11 and OP21 constitute the opening edges 11*f*, which are positioned in the first opening side of the second portions 11A. Moreover, the top 11*d* of the second portion 11A is exposed. At this point, the first openings OP11 and OP21 are buried by the first cylinder dielectric 9.

(Forming Step of Second Cylinder Dielectric (Second Dielectric))

Figure 8A:
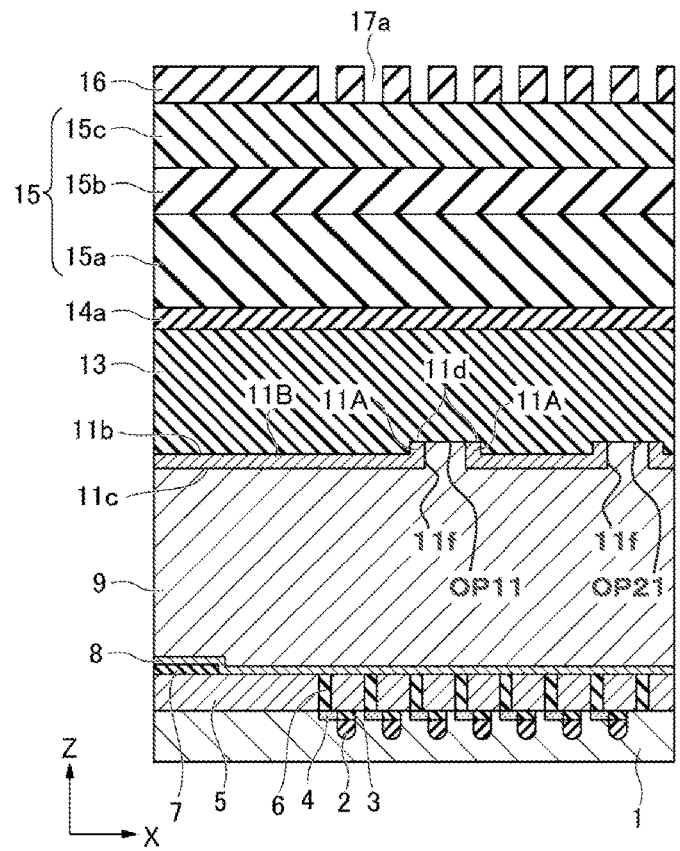
FIGS. 8A and 8B show sectional views for explaining the manufacturing method of the semiconductor device according to the embodiment of the present invention.
Figure 8B:
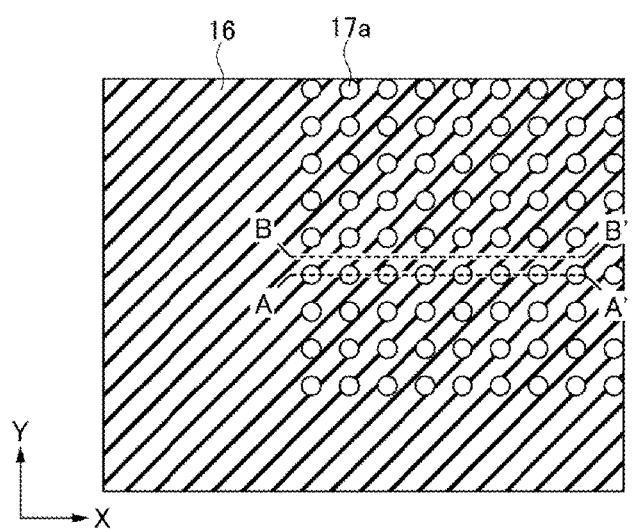

Next, FIG. 8A and FIG. 8B will be referenced. FIG. 8B is a plan view corresponding to FIG. 2 and FIG. 5B. FIG. 8A corresponds to an A-A' cross section shown in FIG. 8B.

The organic coating film 12 remaining in FIG. 7 is selectively removed by a dry etching method. Then, a second cylinder dielectric (second dielectric) 13 is formed. A non-doped silicon oxide film is used as the second cylinder dielectric 13.

(Forming Step of Cylinder Holes)

Then, a second silicon nitride film (second beam material) 14*a*, a hard mask film 15, and an organic mask film 16 are sequentially formed and stacked. The hard mask film 15 includes a film stack of an amorphous silicon film 15*a*, a silicon oxide film 15*b*, and an amorphous carbon film 15*c*. Then, a plurality of circular cylinder hole patterns 17*a* are formed in the organic mask film 16 by a lithography and dry etching method. As described above, part of the cylinder hole patterns 17*a* is formed to be positionally aligned so as to be overlapped with the opening edges 11*f* of the first openings OP11 and OP21.

Figure 9A:
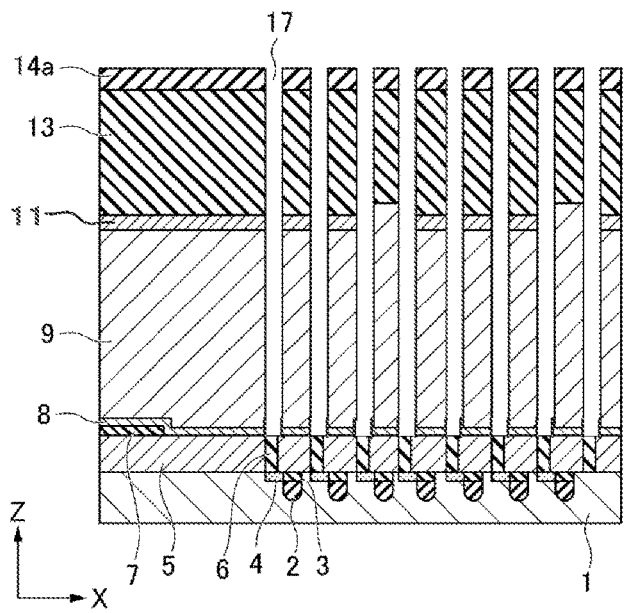
FIGS. 9A and 9B show sectional views for explaining the manufacturing method of the semiconductor device according to the embodiment of the present invention.
Figure 9B:
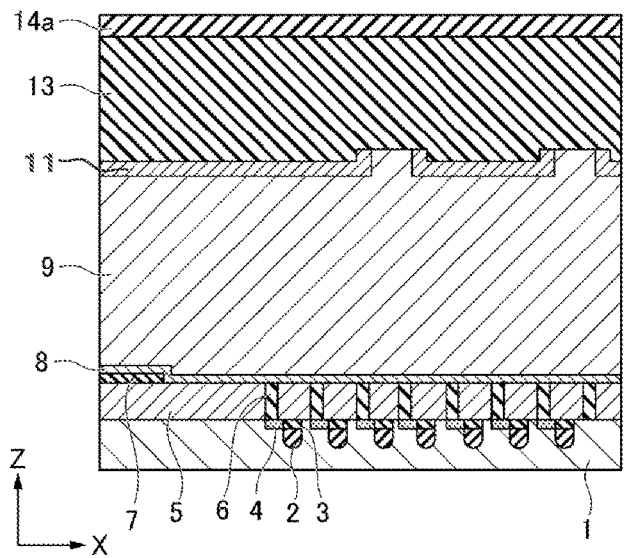

Then, FIG. 9A and FIG. 9B will be referenced. FIG. 9A corresponds to the A-A' cross section of the plan view of FIG. 8B, and FIG. 9B corresponds to a B-B' cross section of the plan view of FIG. 8B. First, the hard mask film 15 is etched by an anisotropic dry etching method using the organic mask film 16 as a mask. As a result, the cylinder hole patterns 17*a* are transferred to the amorphous silicon film 15*a*. Then, cylinder holes 17, are formed by an anisotropic dry etching method using the amorphous silicon film 15*a* as a mask to penetrate through the second silicon nitride film 14*a*, the second cylinder dielectric 13, the first beam 11, the first cylinder dielectric 9, and the stopper silicon nitride film 8. As a result, the tops of the contact plugs 6 are exposed from the bottoms of the cylinder holes 17. Then, the amorphous silicon film 15*a* is selectively removed. In the cross section shown in FIG. 9B, since the cylinder hole patterns 17*a* are not formed, the cylinder holes 17 of FIG. 9A are not formed.

(Forming Method of Second Beam and Second Openings)

Figure 10A:
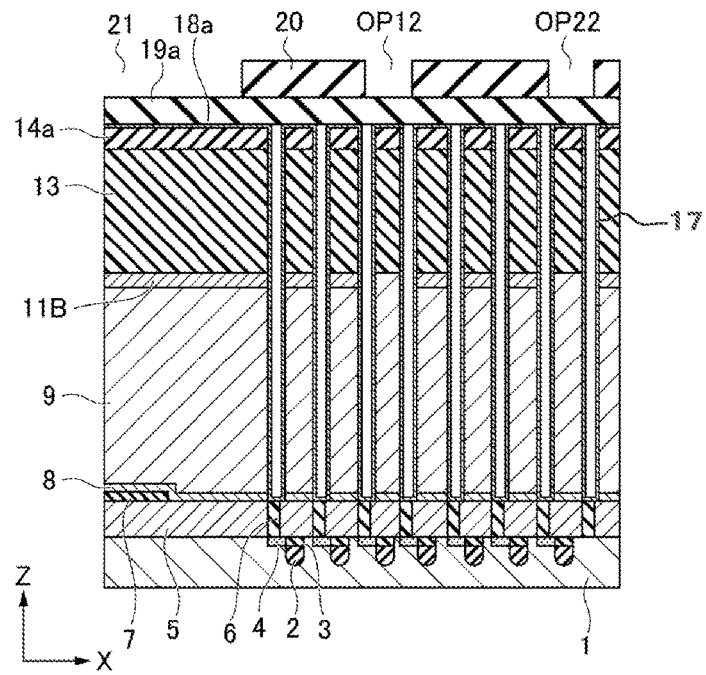
FIGS. 10A and 10B show sectional views for explaining the manufacturing method of the semiconductor device according to the embodiment of the present invention.
Figure 10B:
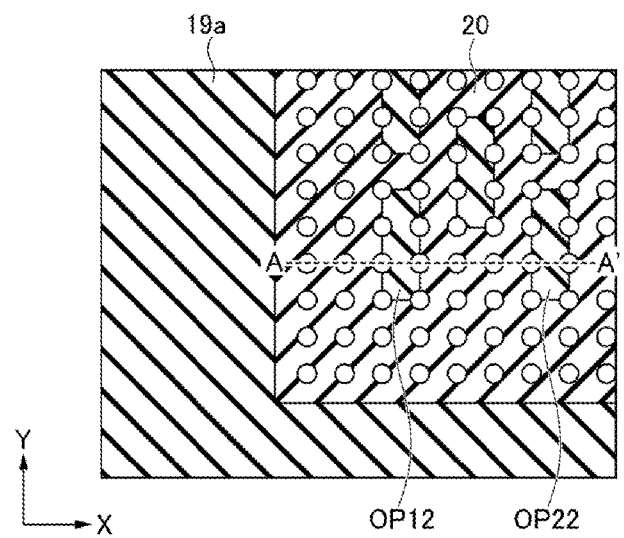
Figure 11A:
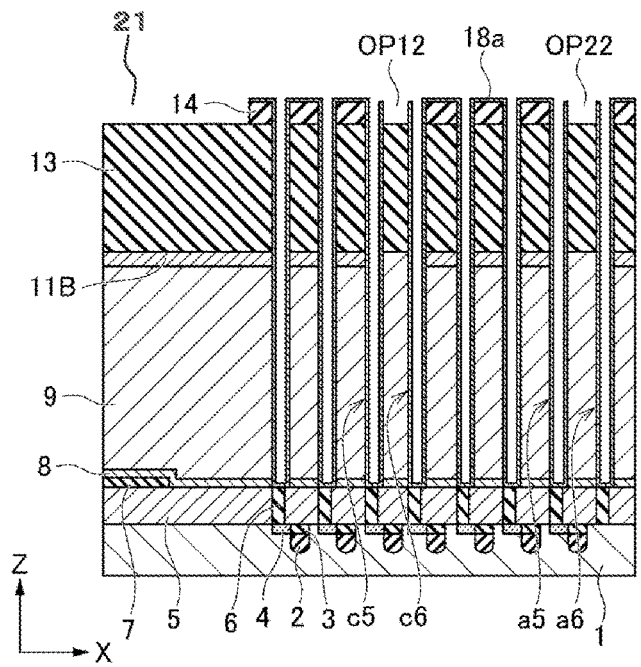
FIGS. 11A and 11B show sectional views for explaining the manufacturing method of the semiconductor device according to the embodiment of the present invention.
Figure 11B:
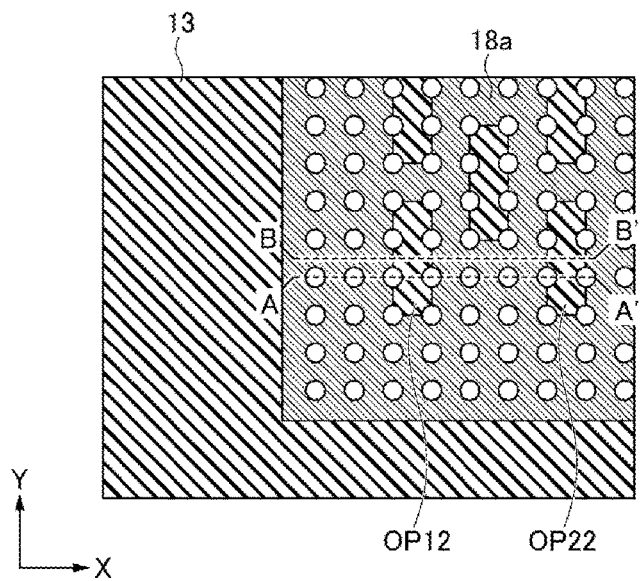

Then, as shown in FIG. 10A, FIG. 10B, FIG. 11A, and FIG. 11B, a forming step of the second beam 14 is carried out. FIG. 10A corresponds to an A-A' cross section shown in FIG. 10B. FIG. 11A corresponds to an A-A' cross section shown in FIG. 11B.

First, as shown in FIG. 10A, a lower electrode material 18a is formed on the entire surface including the inner surfaces of the cylinder holes 17. A metal such as titanium nitride can be used as the lower electrode material 18a.

Then, a protection film 19a including a silicon oxide film is formed on the entire surface by using a plasma CVD method. The protection film 19a is formed by the plasma CVD method and has a no-conformal step coverage. Therefore, the protection film 19a is not formed in the cylinder holes 17 as shown in FIG. 10A, and the upper ends thereof become a closed state. The protection film 19a is formed in order to prevent a mask film including a photoresist from being formed in the cylinder holes 17 in a lithography step carried out in a later step. This is for a reason that it is difficult to remove the organic substances in the cylinder holes having a large aspect ratio.

Then, a mask film 20 is formed to have second opening patterns on the protection film 19a by lithography method. As a result, the peripheral opening 21 is formed in the peripheral circuit region PCA, and the mask film 20 covering the memory cell region MCA is formed as shown in FIG. 10B. The patterns corresponding to the second openings OP12 and OP22 similar to the first openings are formed in the mask film 20, and each of the second openings is formed to straddle eight cylinder holes. The second opening patterns are formed so as to be positionally aligned in the Z direction with respect to the first openings.

Then, as shown in FIG. 11A, the protection film 19a, which is exposed in the peripheral opening 21 and the second openings OP12 and OP22, is removed while using the mask film 20 as a mask. As a result, the lower electrode material 18a is exposed in the openings. Then, the lower electrode material 18a is removed. Furthermore, the second silicon nitride film 14a, which is an exposed lower layer, is removed. At the same time, the mask film 20 is etched and disappears. As a result, the second cylinder dielectric 13 is exposed in the openings. Moreover, as shown in FIG. 11A, the second beam 14, which includes the silicon nitride film 14a, is formed in the memory cell region MCA.

(Removing Step of Second Cylinder Dielectric)

Figure 12:
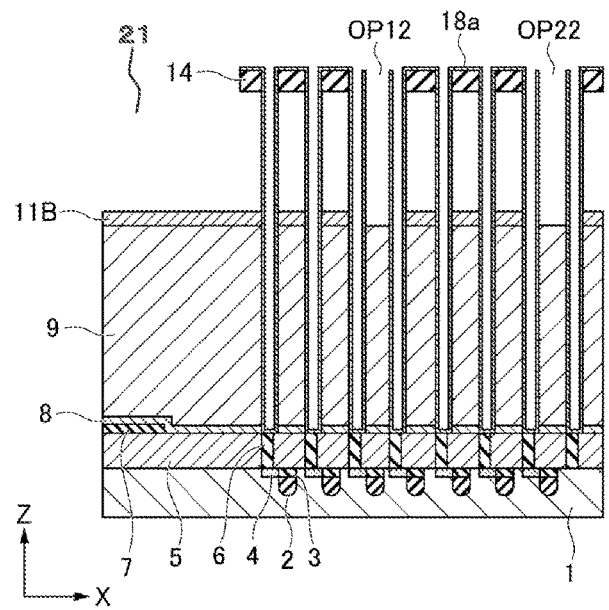
FIG. 12 is a sectional view for explaining the manufacturing method of the semiconductor device according to the embodiment of the present invention.

Then, as shown in FIG. 12, the second cylinder dielectric 13 is removed. A hydrofluoric-acid-containing solution is used in removal of the second cylinder dielectric 13. Since the hydrofluoric-acid-containing solution is isotropically diffused in the second cylinder dielectric 13, the solution is diffused also in a lateral direction via the peripheral opening 21 and the second openings OP12 and OP22, and the second cylinder dielectric 13 positioned below the second beam 14 can be also etched.

Figure 13:
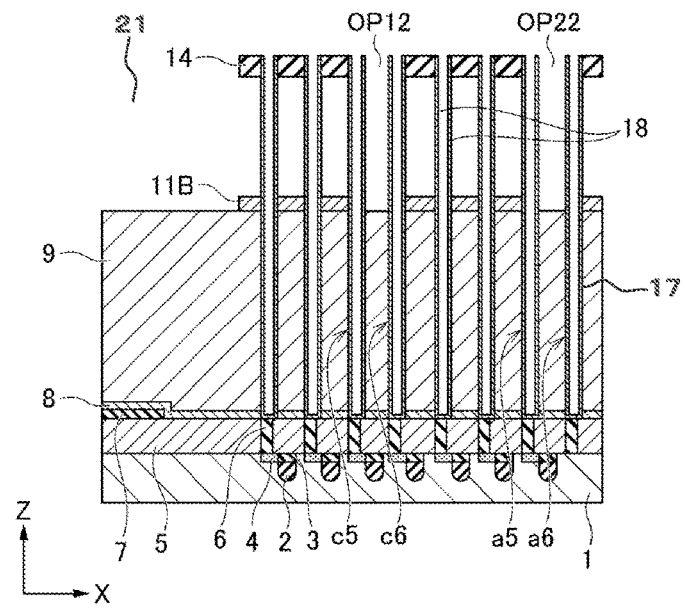
FIG. 13 is a sectional view for explaining the manufacturing method of the semiconductor device according to the embodiment of the present invention.

Then, as shown in FIG. 13, the first portion 11B of the first beam 11 which is exposed in the peripheral opening 21 is removed. Specifically, the first portion 11B including a silicon nitride film is removed by an anisotropic dry etching method using the lower electrode material 18a on the top of the second beam 14, as a mask. As a result, the top of the first cylinder dielectric 9 is exposed in each of the openings.

Then, the lower electrode material 18a on the top of the second beam 14, is selectively removed by a dry etching method. As a result, the plurality of independent lower electrodes 18 corresponding to the respective cylinder holes 17 are formed. For example, the lower electrodes c5, c6, a5, and a6 in contact with the second openings OP12 and OP22, are formed.

(Removing Step of First Cylinder Dielectric)

Figure 14:
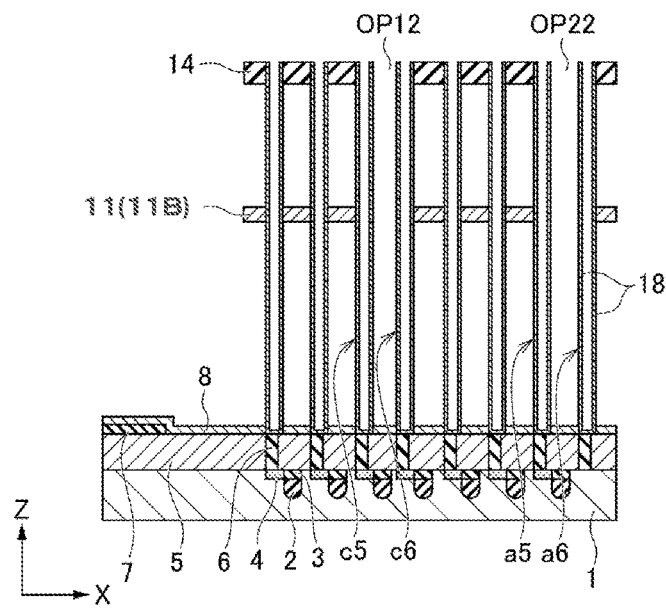
FIG. 14 is a sectional view for explaining the manufacturing method of the semiconductor device according to the embodiment of the present invention.
Figure 15:
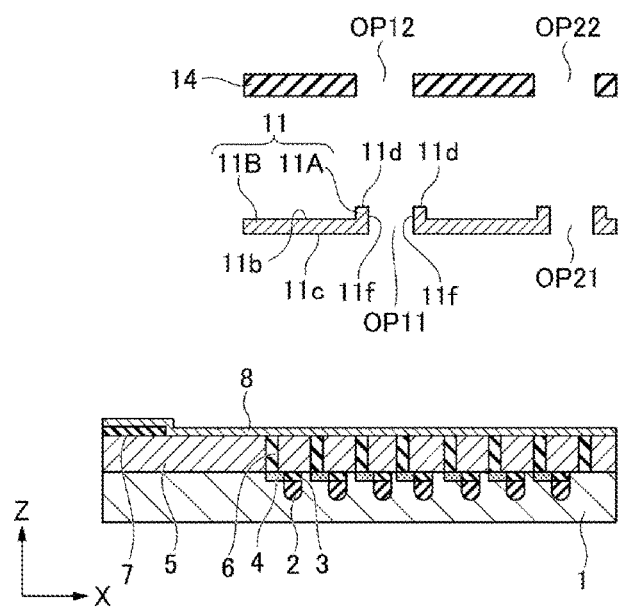
FIG. 15 is a sectional view for explaining the manufacturing method of the semiconductor device according to the embodiment of the present invention.

Then, as shown in FIG. 14, the first cylinder dielectric 9 is removed as well as the second cylinder dielectric by using a hydrofluoric-acid-containing solution. FIG. 15 corresponds to the cross section at the line B-B' shown in FIG. 11B. When the first cylinder dielectric 9 is removed, the plurality of lower electrodes 18 are formed to be supported by the first beam 11 and the second beam 14. All of the sidewalls of the lower electrodes 18 excluding part of the outer sidewalls in contact with the beams are exposed and function as capacitors.

Through the above manufacturing steps, formed is the lower electrodes 18 having the sidewalls supported by the second beam 14, which couples the Z-direction upper ends of the plurality of lower electrodes 18, and the first beam 11, which includes the first portions 11B having the first film thickness and the second portions 11A having the second film thickness thicker than the first film thickness and couples Z-direction intermediate parts of the plurality of lower electrodes 18.

(Forming Step of Capacitor Mold)

Next, FIG. 1 will be referenced. The unshown capacitor dielectric, the upper electrode 22, the second interlayer dielectric 23, the via plug 24, and the supply wiring 25 are formed by publicly-known manufacturing methods. A DRAM can be manufactured by further repeating formation of an unshown interlayer dielectric and formation of a wiring layer According to the above described steps, a manufacturing method of a semiconductor device configured to include at least: a step of forming the first dielectric (first cylinder dielectric) 9 on the semiconductor substrate 1; a step of forming the convex patterns 10 on the top of the first dielectric; a step of forming the first beam material on the entire surface including the sidewalls 10a; a step of forming the first beam 11 including the first portions 11B, which are positioned on the bottoms in the peripheries of the convex patterns 10, and the second portions 11A, which are positioned at the convex patterns 10 and projecting in the perpendicular direction from the first portion 11B, thereby forming the first openings on the tops of the convex patterns 10; and a step of forming the lower electrodes at the positions overlapped with the second portions 11A in the planar view is provided.

First Modification Example

In the above described embodiment, the example in which the first beam 11 includes the first portion 11B and the second portions 11A, which projects from the first portion 11B to the upper side, has been explained. In a first modification example, an example in which the second portions 11A projects to the upper side and to the lower side will be explained by using FIG. 16 to FIG. 19.

Figure 16:
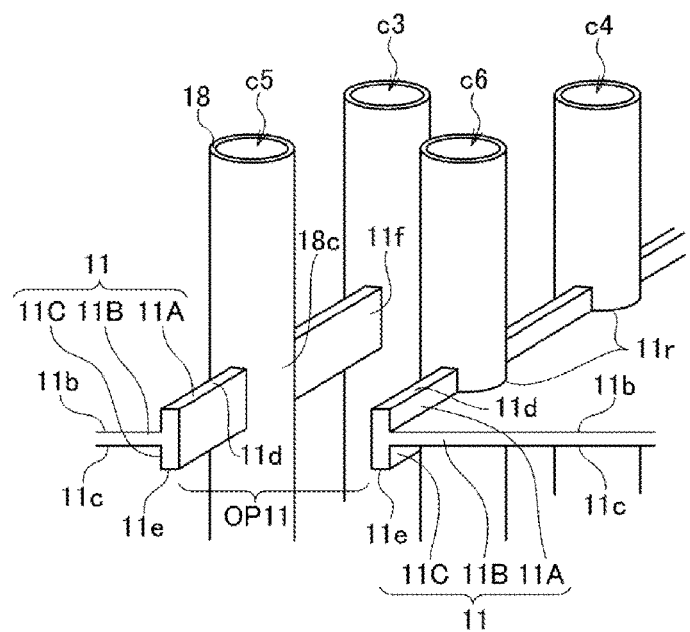
FIG. 16 is a perspective view for explaining the state of contact between the lower electrodes 18 and the first beam 11 in a first modification example.

FIG. 16 is a perspective view showing the state of contact between the lower electrodes 18 and the first beam 11. In addition to the first portion 11B and the second portions 11A, the first beam 11 of the first modification example includes third portions 11C, which projects to the lower side from the first portion 11B. Here, the third portion 11C is handled as a part of the second portion 11A. Accordingly, the second portion 11A includes the third portion 11C unless describing in detail. Therefore, the sidewalls of the lower electrodes 18, which are positioned to face the first opening OP11, are in contact with all of: the arcs 11r of the first portion 11B, the cross-sections of the second portions 11A, and the cross sections of the third portions 11C.

Figure 17:
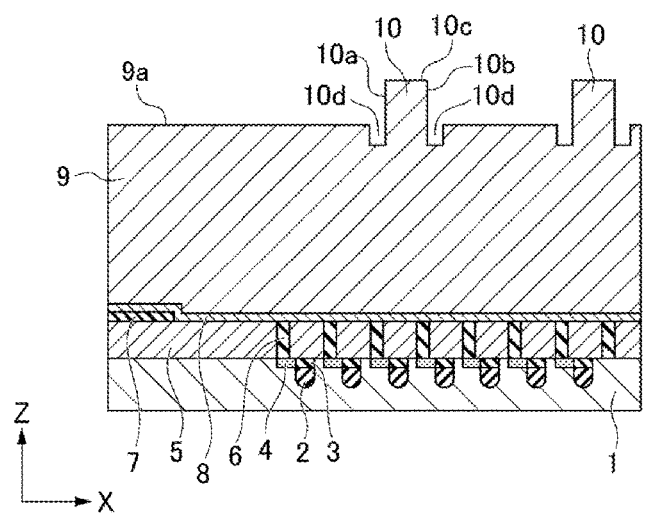
FIG. 17 is a sectional view for explaining a manufacturing method of the semiconductor device according to the first modification example.
Figure 18:
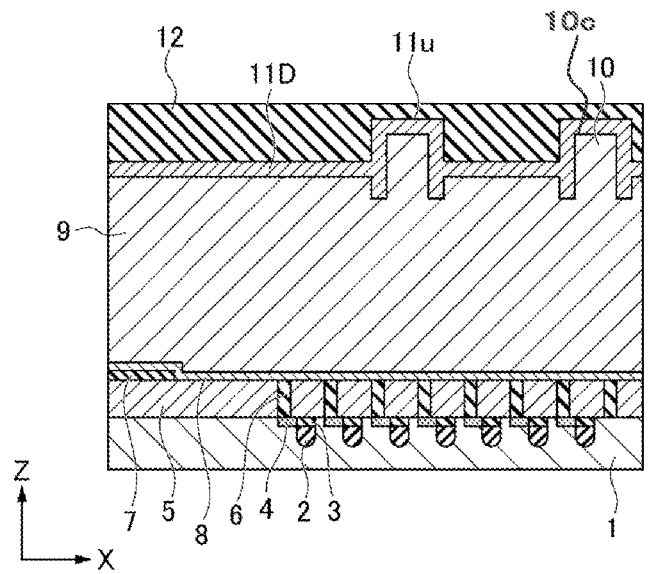
FIG. 18 is a sectional view for explaining the manufacturing method of the semiconductor device according to the first modification example.
Figure 19:
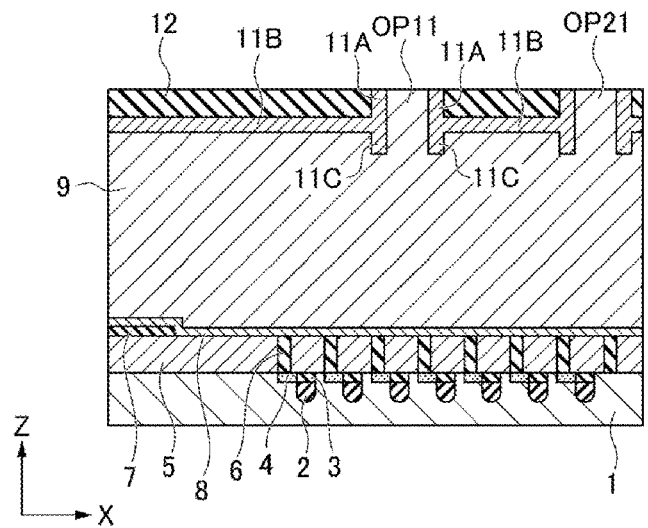
FIG. 19 is a sectional view for explaining the manufacturing method of the semiconductor device according to the first modification example.

FIG. 17 to FIG. 19 are cross-sectional views showing manufacturing steps of the first modification example. As well as FIG. 5A explained in the above described embodiment, after a mask film is formed on the top of the first cylinder dielectric 9, the convex patterns 10 are formed by carrying out anisotropic dry etching; wherein, sub-trenches 10d are formed immediately below the sidewalls of the convex patterns 10 by controlling the conditions in the anisotropic dry etching. The sub-trench 10d is continuously formed in the entire periphery of the convex pattern 10 in a planar view. The formation of the sub-trenches is largely affected by the magnitude of ion bombardment in gas plasma; wherein, the larger bias power, the more easily they are generated. The conditions excluding those of sub-trench formation are the same as those of the above described embodiment.

After the sub-trenches 10d are formed, as shown in FIG. 18, the first silicon nitride film 11D is formed, and the organic coating film 12 is formed. Then, as shown in FIG. 19, the entire surface is etched back by a dry etching method to remove the top silicon nitride film 11u, which is formed on the tops 10c of the convex patterns 10. As a result, the first openings OP11 and OP21 are formed, and the second portions 11A and the third portions 11C are formed in addition to the first portion 11B.

Second Modification Example

In a second modification example, an example in which the second beam 14 includes a first portion and second portions, which projects from the first portion to the lower side, will be explained by using FIG. 20.

Figure 20:
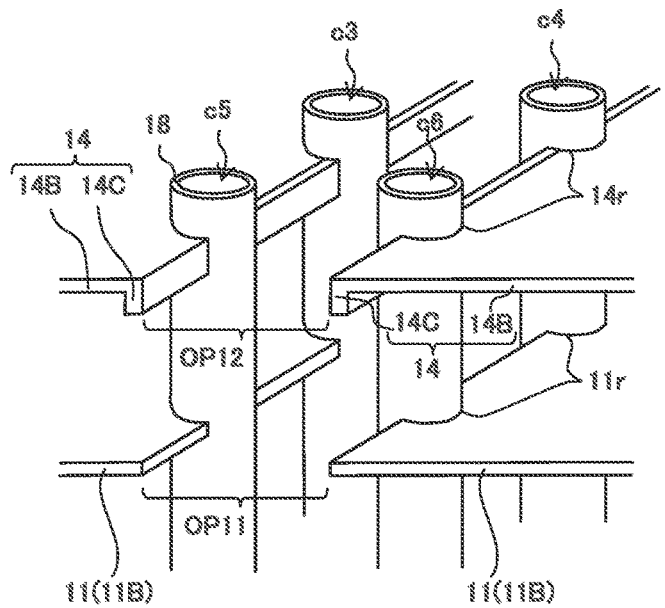
FIG. 20 is a perspective view for explaining the state of contact between the lower electrodes 18, the first beam 11 and a second beam 14 in a second modification example.

FIG. 20 is a perspective view showing the state of contact between the lower electrodes 18, the first beam 11, and the second beam 14. The first beam 11 of the second modification example includes the first portion 11B, which extends in the X direction and the Y direction parallel to the top of the semiconductor substrate 1. Moreover, the second beam 14 includes the first portion 14B, which extends in the X direction and the Y direction parallel to the top of the semiconductor substrate 1, and the second portions 14C, which projects from the first portion 14B to the lower side. Therefore, the sidewalls of the lower electrodes 18 which are positioned to face the first opening OP11 and the second opening OP12, are in contact with all of the arcs 11r of the first portion 11B, arcs 14r of the first portion 14B, and the cross sections of the second portions 14C.

Third Modification Example

In a third modification example, an example in which the first portion 14B, which constitutes the second beam 14, is connected to the second portions 11A, which constitute the first beam 11, will be explained by using FIG. 21.

Figure 21:
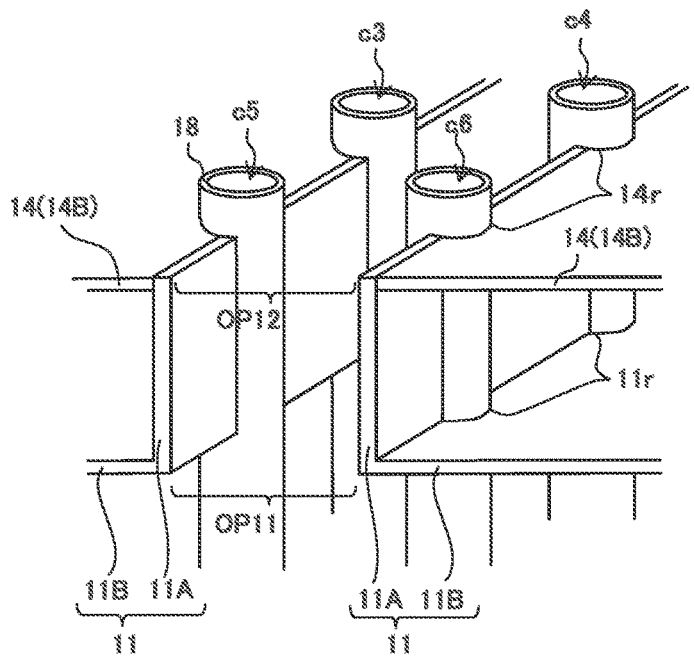
FIG. 21 is a perspective view for explaining the state of contact between the lower electrodes 18, the first beam 11, and the second beam 14 in a third modification example.

FIG. 21 is a perspective view showing the state of contact between the lower electrodes 18, the first beam 11, and the second beam 14. The second beam 14 of the present third modification example includes the first portion 14B, which extends in the X direction and the Y direction parallel to the top of the semiconductor substrate 1. Moreover, the first beam 11 includes the first portion 11B, which extends in the X direction and the Y direction parallel to the top of the semiconductor substrate 1, and the second portions 11A, which projects from the first portion 11B to the upper side in the Z direction perpendicular to the top of the semiconductor substrate 1 and are connected to the cross sections of the first portion 14B. Therefore, the sidewalls of the lower electrodes 18, which are positioned to face the first opening OP11 and the second opening OP12, are in contact with the arcs 11r of the first portion 11B, the arcs 14r of the first portion 14B, and the cross sections of the second portions 11A, which are connected to the cross sections of the first portion 11B and the first portion 14B.

Note that, in this case, the second portions 11A are connected to the cross sections of the first portion 11B and the first portion 14B. However, instead of the second portions 11A, the second portions 14C shown in the second modification example can be connected to the cross sections of the first portion 11B and the first portion 14B.

Furthermore, when the second beam 14 includes the second portions 14C, the second portions 11A can be connected to the second portions 14C.

Hereinabove, the preferred embodiment of the present invention has been explained. However, the present invention is not limited to the above described embodiment. It goes without saying that various modifications can be made within the range not departing from the gist of the present invention, and they are also included in the range of the present invention.

For example, in the above described embodiment, the case in which the present invention is applied to the semiconductor device provided with the beams supporting the lower electrodes of the capacitors has been explained. However, the application target of the present invention is not limited thereto. The present invention can be widely applied to a semiconductor device that includes a beam(s) supporting a plurality of pillars extending in a perpendicular direction with respect to the surface of a semiconductor substrate.

Moreover, in the above described embodiment, the lower electrodes are not required to be disposed like a lattice as shown in FIG. 2. For example, the lower electrodes may be arranged by hexagonal closest packing structure. Only the first and second portions are not required to be contacted with the pillar. For example, a first portion comprising a first part contacting with the pillar, a second portion extending upwardly or downwardly from a second part of the first portion comprising an edge contacting with the pillar, and a third portion extending upwardly or downwardly from a third part of the first portion and comprising an edge contacting with the pillar, may be contacted with the pillar. In this case, the second portion may be opposed to the third portion via the pillar. The openings provided in the beams are rectangular, but are not limited to this shape. For example, the openings may be circular. For example, the closet three pillars of the plurality of pillars constituting the hexagonal closest packing structure may be tied by the second or third portions such that the three pillars and the second or third portions constitutes a circle.

What is claimed is:
1. A semiconductor device, comprising:
a semiconductor substrate;
a plurality of conductive pillars provided over the semiconductor substrate, the pillars having laterally-outer conductive side surfaces;
a dielectric structure spaced vertically above the semiconductor substrate, the dielectric structure comprising an opening extending vertically there-though and contacting the laterally-outer conductive side surfaces of all of the pillars, the dielectric structure comprising a horizontally-extending first dielectric member that horizontally-extends to the opening, the dielectric structure comprising a second dielectric member that contacts the first dielectric member adjacent the opening and that contacts the laterally-outer conductive side surfaces of only some of the pillars, the second dielectric member extending and projecting vertically from the first dielectric member adjacent the opening, the second dielectric member having a greater maximum vertical thickness than a minimum vertical thickness of the first dielectric member, the second dielectric member having a minimum lateral thickness that is greater than the minimum vertical thickness of the first dielectric member; and the pillars being hollow, the dielectric structure only being outside the hollow pillars.

2. The semiconductor device of claim 1, wherein the second dielectric member projects upwardly.

3. The semiconductor device of claim 1, wherein the second dielectric member projects downwardly.

4. The semiconductor device of claim 1, wherein the second dielectric member projects upwardly and downwardly.

5. The semiconductor device of claim 1, wherein the first and second dielectric members comprise silicon nitride.

6. The semiconductor device of claim 1, wherein the semiconductor device comprises a memory device comprising memory cells individually comprising a capacitor, the pillars individually comprising a storage electrode of the individual capacitors of the individual memory cells.

7. The semiconductor device of claim 1, wherein the first dielectric member comprises silicon nitride.

8. The semiconductor device of claim 1, wherein the second dielectric member comprises silicon nitride.

9. The semiconductor device of claim 1, wherein the second dielectric member projects upwardly and contacts another structure that is above the dielectric structure.

10. The semiconductor device of claim 9, wherein the another structure is dielectric.

11. A semiconductor device, comprising:
a semiconductor substrate;
a plurality of conductive pillars provided over the semiconductor substrate, the pillars having laterally-outer conductive side surfaces; and
a dielectric structure spaced vertically above the semiconductor substrate, the dielectric structure comprising an opening extending vertically there-though and contacting the laterally-outer conductive side surfaces of all of the pillars, the dielectric structure comprising a horizontally-extending first dielectric member that horizontally-extends to the opening, the dielectric structure comprising a second dielectric member that contacts the first dielectric member adjacent the opening and that contacts the laterally-outer conductive side surfaces of only some of the pillars, the second dielectric member extending and projecting vertically from the first dielectric member adjacent the opening, the second dielectric member having a greater maximum vertical thickness than a minimum vertical thickness of the first dielectric member, the conductive pillars individually having a conductive uppermost surface, the second dielectric member having a dielectric uppermost surface that is downward of the conductive uppermost surface of the individual conductive pillars.

12. A memory device comprising memory cells individual comprising a capacitor, comprising:
a semiconductor substrate;
a plurality of conductive pillars provided over the semiconductor substrate, the pillars having laterally-outer conductive side surfaces, the pillars individually comprising a storage electrode of the individual capacitors of the individual memory cells;
a dielectric structure spaced vertically above the semiconductor substrate, the dielectric structure comprising an opening extending vertically there-though and contacting the laterally-outer conductive side surfaces of all of the pillars, the dielectric structure comprising a horizontally-extending first dielectric member that horizontally-extends to the opening, the dielectric structure comprising a second dielectric member that contacts the first dielectric member adjacent the opening and that contacts the laterally-outer conductive side surfaces of only some of the pillars, the second dielectric member extending and projecting vertically from the first dielectric member adjacent the opening, the second dielectric member having a greater maximum vertical thickness than a minimum vertical thickness of the first dielectric member; and
the second dielectric member having a dielectric uppermost surface and a laterally-outer side surface extending downwardly from the dielectric uppermost surface, the capacitors comprising a capacitor dielectric material that is over and contacts the dielectric uppermost surface of the second dielectric member and contacts the laterally-outer side surface of the second dielectric member.

* * * * *